United States Patent
Bronner et al.

(10) Patent No.: US 6,242,770 B1
(45) Date of Patent: Jun. 5, 2001

(54) DIODE CONNECTED TO A MAGNETIC TUNNEL JUNCTION AND SELF ALIGNED WITH A METALLIC CONDUCTOR AND METHOD FOR FORMING THE SAME

(76) Inventors: Gary Bela Bronner, 35 Woodcliff Dr., Stormville, NY (US) 12582; Stephen McConnell Gates, 22 Inningwood Rd., Ossining, NY (US) 10562; Roy Edwin Scheuerlein, 22145 Orchard Ct., Cupertino, CA (US) 95014

( * ) Notice: Subject to any disclaimer, the term of this patent is extended or adjusted under 35 U.S.C. 154(b) by 0 days.

(21) Appl. No.: 09/144,067

(22) Filed: Aug. 31, 1998

(51) Int. Cl.[7] .......................... H01L 29/76; H01L 29/94; H01L 31/062; H01L 31/113; H01L 31/119
(52) U.S. Cl. .............................................. 257/295
(58) Field of Search .................. 438/3, 73, 231, 438/275; 365/171, 173, 158; 257/288, 295

(56) References Cited

U.S. PATENT DOCUMENTS

| | | | |
|---|---|---|---|
| 5,582,640 | * 12/1996 | Okada et al. ........................... | 117/8 |
| 5,640,343 | * 6/1997 | Gallagher et al. ..................... | 365/171 |
| 5,703,805 | 12/1997 | Tehrani et al. ......................... | 365/173 |
| 5,734,605 | 3/1998 | Zhu et al. ............................... | 365/158 |
| 5,734,606 | 3/1998 | Tehrani et al. ......................... | 365/173 |
| 5,748,524 | 5/1998 | Chen et al. ............................. | 365/173 |
| 5,757,695 | 5/1998 | Shi et al. ................................ | 365/158 |
| 5,768,181 | 6/1998 | Zhu et al. ............................... | 365/158 |
| 5,768,183 | 6/1998 | Zhu et al. ............................... | 365/171 |
| 5,902,690 | * 5/1999 | Tracy et al. ............................ | 428/693 |
| 5,991,193 | * 11/1999 | Gallagher et al. ..................... | 365/171 |

* cited by examiner

Primary Examiner—Long Pham
Assistant Examiner—William David Coleman
(74) Attorney, Agent, or Firm—Marian Underweiser, Esq.; McGinn & Gibb, PLLC

(57) ABSTRACT

A magneto-resistive memory cell and a method of forming the memory cell, includes a substrate, a single crystalline semiconductor diode formed in the substrate; and a first thin film conductor recessed in the substrate, and a second thin film conductor form above a magnetic tunnel junction formed on the diode. The diode and first thin film conductor share a non-planar common surface, such that the metal tunnel junction is a predetermined distance from the thin film conductor.

24 Claims, 7 Drawing Sheets

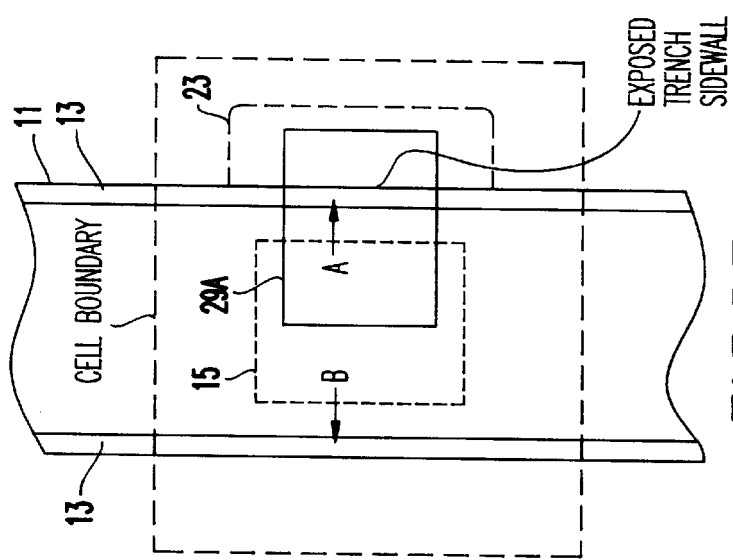
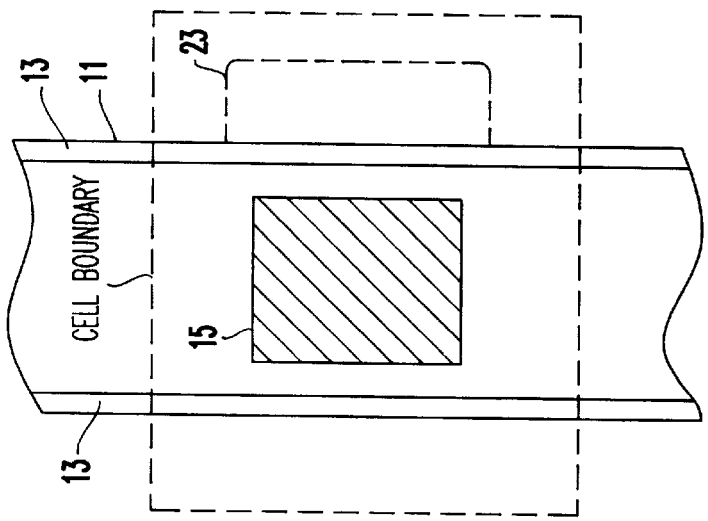
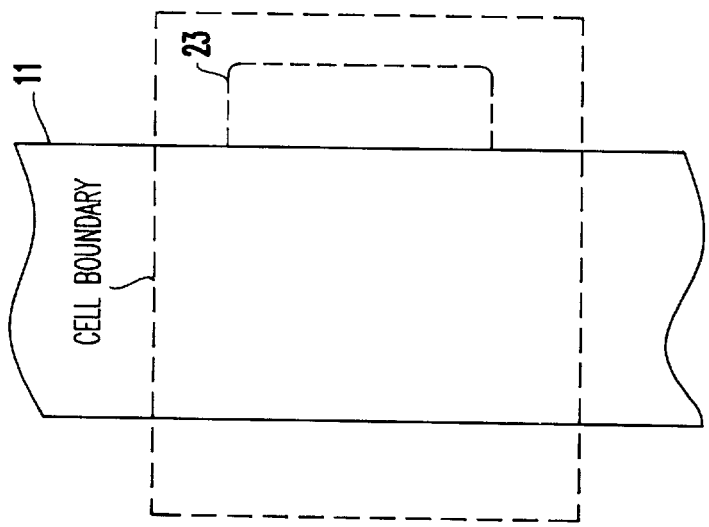

DIODE CONNECTED TO A MAGNETIC TUNNEL JUNCTION AND SELF ALIGNED WITH A METALLIC CONDUCTOR AND METHOD FOR FORMING THE SAME

BACKGROUND OF THE INVENTION

1. Field of the Invention

The present invention generally relates to a nonvolatile memory device used for computer main storage, and more particularly to a nonvolatile memory array that use magnetic memory elements as the individual memory cells.

2. Description of the Related Art

Magnetic random access-memory (MRAM or typically referred to as "MagRam") technology is a solid state tunnel junction using magnetic electrodes, and is useful as a storage mechanism. The storage mechanism relies on the relative orientation of the magnetization of two electrodes, and on the ability to discern this orientation by electrical means.

MRAM arrays include an array of magnetic memory cells positioned at the intersections of wordlines and bitlines.

Generally, each cell includes a magnetically changeable or "free" region, and a proximate magnetically reference region, arranged into a magnetic tunnel junction ("MTJ") device (e.g., the term "reference region" is used broadly herein to denote any type of region which, in cooperation with the free or changeable region, results in a detectable state of the device as a whole).

Generally, the principle underlying storage of data in such cells is the ability to change the relative orientation of the magnetization of the free and reference regions by changing the direction of magnetization along the easy axis ("EA") of the free region, and the ability to thereafter read this relative orientation difference.

More particularly, an MRAM cell is written by reversing the free region magnetization using applied bi-directional electrical currents and resultant magnetic stimuli via its respective bitline and wordline.

The MRAM cell is later read by measuring the resultant tunneling resistance between the bitline and wordline, which assumes one of two values depending on the relative orientation of the magnetization of the free region with respect to the reference region. If the free region is modeled as a simple elemental magnet having a direction of magnetization which is free to rotate but with a strong preference for aligning in either direction along its easy axis (+EA or −EA), and if the reference region is a similar elemental magnet but having a direction of magnetization fixed in the +EA direction, then two states (and therefore the two possible tunneling resistance values) are defined for the cell: aligned (+EA/+EA) and anti-aligned (−EA/+EA).

The resistance of the tunnel junction can assume one of two distinct values with no applied stimulus (e.g., there is a lack of sensitivity of resistance to applied field below the easy axis flipping field strength +/−$H_c$).

For example, if the applied easy axis field exceeds +/−$H_c$, then the cell is coerced into its respective high resistance (anti-aligned magnetization of the free region with respect to the reference region) or low resistance (aligned magnetization of the free region with respect to the reference region) state.

Thus, in operation as a memory device, the MRAM device can be read by measuring the tunneling resistance, thereby to infer the magnetization state of the storage layer with respect to the fixed layer. The MRAM can be written by reversing free layer magnetization using external magnetic fields or the magnetic stimuli resulting from bitline and wordline currents. If the free layer is imagined as a simple elemental magnet which is free to rotate but with a strong energetic preference for aligning parallel to the X axis, and if the pinned layer is a similar elemental magnet but frozen in the +X direction, then there are only two states possible for the device (e.g., aligned and not-aligned).

The crosspoint magnetic tunnel junction (MTJ) magneto-resistive memory cell requires a diode (e.g., specifically a diode formed in a thin film of semiconductor material or thin film diode (TFD)) in series with each magnetic tunnel junction (MTJ) memory element. Then, the sense current flows through only one memory element instead of through N elements, as in conventional series architecture magneto-resistive (M-R) memories. This is advantageous in increasing the signal-to-noise ratio (SNR) by a factor of N at the same sense power (or alternatively decreasing the sense power by N squared at an equal SNR.

A key feature of the crosspoint MTJ M-R memory cell is that each memory element is located at the intersection of two metal thin-film wires (TFW), and the memory element electrically contacts both of the TFWs. This design feature makes possible high density very-large-scale-integrated (VLSI) magneto-resistive memory arrays.

The coincidence of write currents in each of the two metal TFWs causes the free magnetic layer of the memory element to switch to a desired state. Switching the free magnetic layer of the selected memory element occurs without changing the state of the memory elements that are in contact with only one of the two TFWs. The write currents change the selected MTJ resistance state, and are on the order of milli-Amperes in both of the two metal TFW conductors. Accordingly, the lower conductor should be physically close to the MTJ for efficiency in generating the required magnetic field to change the MTJ resistance state.

However, a problem is that the MTJ and the lower conductor have not been in close proximity.

Further, since the sensing operation is a resistance measurement, any series resistance or low conductivity switch in series with the sense current path will detract from the signal.

An alternative structure locating the diode coplanar with the silicon substrate has been disclosed in "Magnetic MRAM Arry With Magnetic Tunnel Junction (MTJ) Cells and Remote Diodes", U.S. patent application no. 09/,116, 261, invented by R.E. Scheuerlein, commonly assigned and incorporated herein by reference, which uses metal TFWs having a conventional (square or rectangular) cross-section, and uses a diode formed in the surface of the Si wafer substrate. A vertical connection from the diode up to the lower electrode of the MTJ is located beside the lower metal conductor TFW, which causes the cell area to be larger than a DRAM cell.

However, such a MRAM cell occupies a larger area, and achieves a lower areal density. The uniformity of the electrical characteristics (such as the on resistance) of the switch/diode is required for good memory arrays. The thin film diodes (TFDs) have greater variations due to their manufacturing and inherent materials variations, which reduces the manufacturing yield of arrays of cells using TFD, and therefore increases the cost.

SUMMARY OF THE INVENTION

In view of the foregoing and other problems of the conventional systems, it is therefore an object of the present invention to provide a high conductivity diode with high rectification ($I_F/I_R$, where $I_F$ and $I_R$ are respectively the diode forward and reverse bias currents).

Another object of the present invention is to provide a diode which has a minimum total resistance.

Yet another object of the invention is to provides an MRAM cell which occupies a lesser area, and which achieves a higher areal density than the conventional cell mentioned above.

In a first aspect of the invention, a diode is located below the metal TFW, and both the diode and the recessed metal TFW share a non-planar common surface (e.g., also described as a surface with a vertical extent).

With this diode configuration, the MTJ can be in very close proximity to the lower conductor. In the crosspoint MTJ memory cell the diode was formed above the write current conductor, and could only be a thin film diode and thin film diodes have inferior rectification (e.g., $I_F/I_R$) as compared to single crystal Si diodes. In the present invention, the diode is made in a single crystalline semiconductor, as shown in FIG. 1 and as described below. Additionally, in the crosspoint MTJ memory, the diode has been formed above the write conductor, and the MTJ was separated from the conductor by the diode.

The present invention improves upon the MRAM cell with remote diode (which is larger than a DRAM cell) because here the diode location is automatically self-aligned with the recessed metal line, and because the present cell occupies an area of approximately 1 metal pitch by 1 metal pitch. Therefore, high areal density arrays of the present structure are easily fabricated, and the areal density may exceed that of a typical DRAM cell.

In another aspect of the present invention, as shown for example, in FIGS. 2A–2H, a stepwise method is provided to form the above-described structure.

In yet another aspect, a V-groove structure is formed as shown for example in FIGS. 4B–4C.

Hence, the present invention places the MTJ and the lower conductor in close proximity.

In the method of the invention, one set of conductors is buried within the silicon and each intersection point of each buried conductor is surrounded by a layered diode so that electrical connection to the MTJ is from each buried conductor and through the surrounding (e.g., buried) diode.

Further, the buried diode has more uniform electrical characteristics than the TFD.

BRIEF DESCRIPTION OF THE DRAWINGS

The foregoing and other objects, aspects and advantages will be better understood from the following detailed description of a preferred embodiment of the invention with reference to the drawings, in which:

FIGS. 3A–3E illustrates a plan view of the structure at various stages of the process shown in FIGS. 2A–2H;

DETAILED DESCRIPTION OF PREFERRED EMBODIMENTS OF THE INVENTION

Figure 1A:
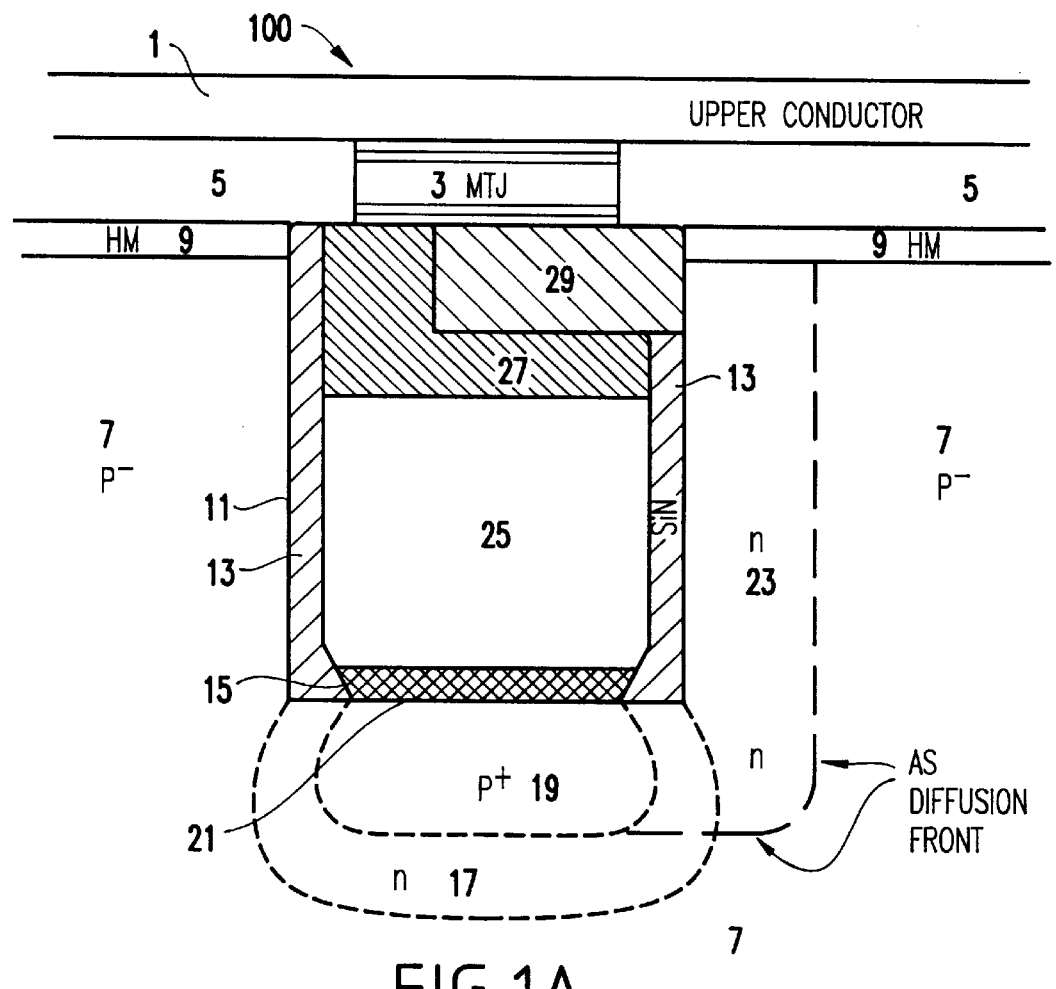
FIG. 1A illustrates a sectional view of a memory cell according to a first embodiment of the present invention.

Referring now to the drawings, and more particularly to FIG. 1A–2H, there is shown a sectional view of the memory cell according to a first embodiment of the present invention.

First Embodiment

In FIG. 1A, a memory structure 100, preferably formed as an MRAM, is shown according to the present invention. Structure 100 includes an upper conductor (e.g., preferably formed of a thin film wire (TFW) such as copper which is a preferred metal material because of its low resistance) 1 is connected to each MTJ 3. Preferably, the upper conductor has a thickness of substantially within a range of about 0.2 $\mu$m to about 0.6 $\mu$m, and most preferably 0.4 $\mu$m. Preferably, the MTJ has a thickness of substantially within a range of about 50 nm to about 300 nm, and most preferably 120 nm.

The space surrounding the MTJs and between the upper conductor 1 and the silicon substrate is filled with an interlayer dielectric 5, formed preferably of silicon dioxide.

Each MTJ is connected to, and fabricated upon, a strap conductor 29 (e.g., preferably formed of either metal or doped polysilicon) having a thickness in the range of about 0.02 to 0.1 $\mu$m. The strap conductor 29 is planarized by chemical mechanical polishing (CMP) to the surface of a hard mask (HM) 9, and the strap 29 makes electrical contact to a heavily doped ntype Si region 23 at the sidewall of the trench 11. The hard mask 9 is preferably formed of silicon nitride or the like.

The strap conductor 29 is located on top of a thin, deposited insulator 27 (e.g., preferably formed of either deposited silicon nitride or silicon oxide) having a thickness of substantially within a range of about 0.01 to about 0.1 $\mu$m. The thin insulator 27 electrically isolates the strap 29 from a bottom conductor 25, and hence the insulator 27 is not part of the schematic circuit of Fig. 1B. The bottom conductor may be formed of the same material as the top conductor and more specifically is preferably formed of copper or tungsten. The strap 29, insulator 27, and the conductor 25 are all contained in a trench 11. The trench 11 has a preferred dimension of F (wide) by 1.5 F (deep), where F is the minimum feature size.

The trench 11 is etched into a p$^-$silicon substrate 7, using the hard mask 9 to define the trench. An arsenic-doped SiO$_2$ (AD SiO$_2$) layer is deposited and selectively removed using anisotropic etching. A sacrificial oxide layer 14 is deposited conformably, the wafer is heated to out diffuse n$^+$region 23 from the AD SiO$_2$, and then the AD SiO$_2$ and layer 14 are removed leaving n$^+$regions self-aligned on the trench sidewalls 23. The trench 11 is lined by a conformal insulator 13, such as silicon nitride or the like, which is also a reaction barrier between the silicon substrate 7 (e.g., wafer) and the bottom conductor 25. The insulator 13 preferably has a thickness within a range of about 0.01 to 0.1 $\mu$m.

At selected locations, a window 15 is etched in the conformal insulator 13, exposing the silicon substrate 7 in the bottom (floor) of the trench 11. The dimensions of window 15 are preferably about F×F.

Two implanted regions 17, 19 (e.g., n and p$^+$, respectively, but of course the conductivity types may be reversed as would be known by one of ordinary skill in the art taldng the present specification as a whole) are located in the silicon at these selected locations, being implanted through the window 15.

Specifically, a relatively deep implant of n-type conductivity forms the n-region 17, whereas a relatively shallow boron implant of p-type conductivity forms the p-region 19. For example, the n-region has a thickness within a range of about 0.3 $\mu$m to about 0.6 $\mu$m, whereas the p-region has a thickness withing a range of about 0.05 $\mu$m to about 0.2 $\mu$m and more particularly the thickness required to avoid shorting of the barrier layer 21 to the n-type region. The n-type region is 3 to 6 times as deep, limited by the spacing between adjacent regions 17 when adjacent rows are packed close together.

A relatively thin reaction barrier 21, having a preferred thickness of about 0.005 to about 0.02$\mu$m, electrically connects the p-region 19 to the bottom conductor 25. Preferably, the reaction barrier is formed of TiN, TaN or TaSiN.

Figure 1B:
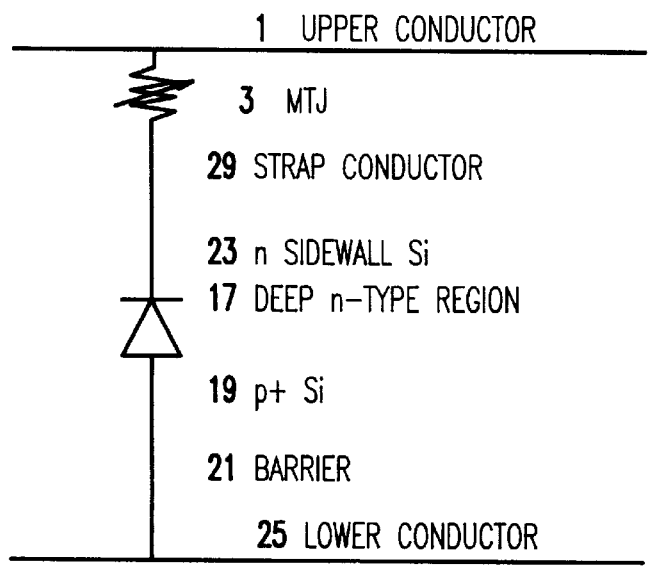
FIG. 1B illustrates a schematic circuit diagram of the memory cell shown in FIG. 1A.

FIG. 1B is a simplified electrical circuit of the memory cell of the present invention, showing the conductive path through the cell. For clarity and consistency, the reference numbers shown in FIG. 1B designate the same structural elements in FIG. 1A.

A process of making the memory cell according the first embodiment of FIGS. 1A–1B is now described with reference to FIGS. 2A–2H and 3A–3E. For clarity and consistency, the same reference numerals as in FIGS. 1A–1B will be used to designate the same structural elements.

FIGS. 2A–2G show sectional views at different steps m the process for producing the structure of the first embodiment. FIGS. 3A–3E show the corresponding plan views at some of the same steps.

Figure 2A:
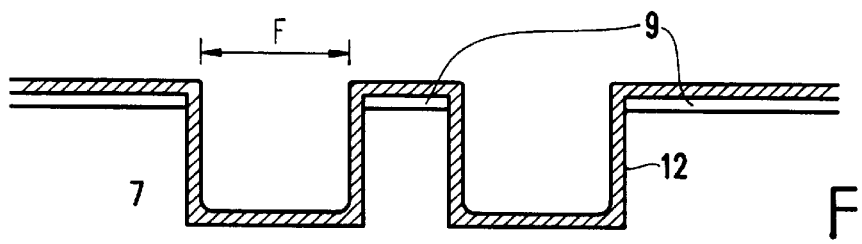
FIGS. 2A–2H illustrate sectional views of a stepwise process to form the structure of FIG. 1A.

As shown in FIG. 2A, in step 1, a hard mask layer 9 of Si nitride is deposited onto a silicon substrate 7, and serves as a CMP etch stop layer during subsequent process steps. This is an advantage of the structure and method of this invention.

In step 2, the hard mask layer 9 is removed where row lines 1 are desired using a mask (FIG. 3A) and a photolithography process.

Then, in step 3, using the hard mask 9, trenches of roughly a 1:1 to 1.5:1 aspect ratio are etched in the Si substrate, and are lined with a thin layer of As-Doped glass (ADSiO$_2$) 12, as shown in FIG. 2A. The AD SiO$_2$ glass is conformally deposited. In a modification of the first embodiment which eliminates one lithography step, the ADSiO$_2$ is anistropically etched so it remains only on the sidewalls of the trenches.

Figure 3A:
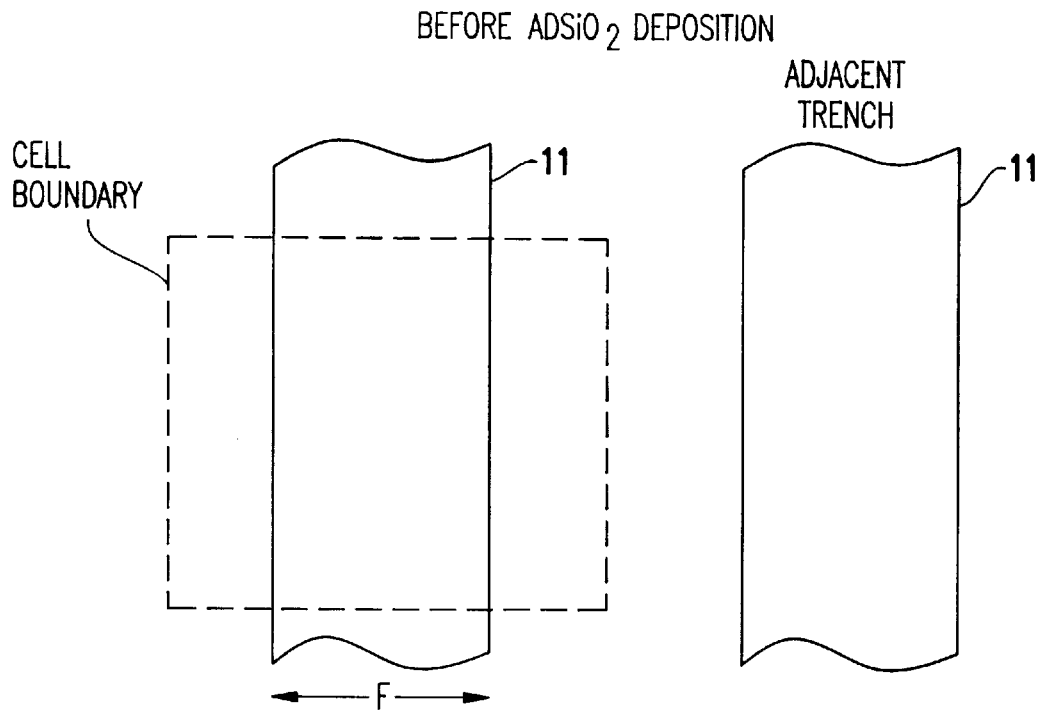
Figure 3B:
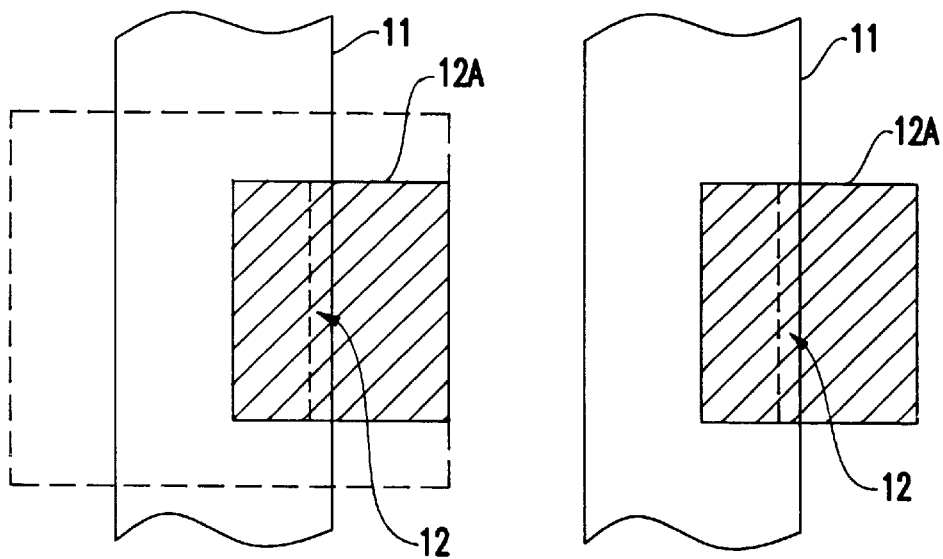

In step 4, in the preferred embodiment as shown in FIG. 3B, a less critical mask pattern 12A and photo lithography process are used to remove a portion of the ADSiO$_2$, leaving approximately a minimum feature size ADSiO$_2$ region for each cell on one sidewall of the cell's row line trench. In the above-mentioned modification of the first embodiment, both sidewalls are coated with ADSiO$_2$.

Figure 2B:
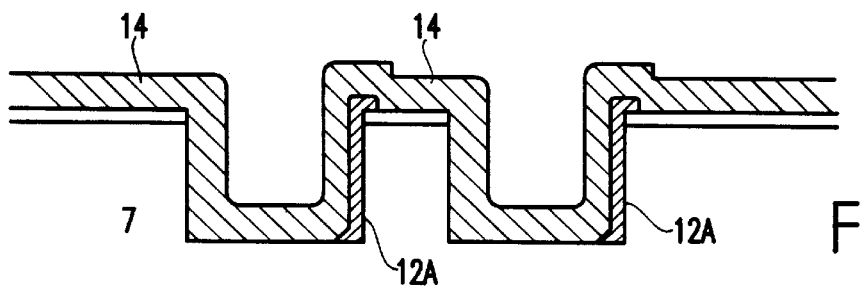

As further shown in FIG. 2B, a sacrificial oxide 14 (e.g., preferably SiO$_2$) is deposited conformally over the entire wafer. The purpose of the conformal layer is to cover the ADSiO$_2$, and to prevent As from contaminating other surfaces by vapor phase diffusion.

In step 5, solid source diffusion is performed in which heating is performed to 1050° C. to diffuse As into wafer 7 forming regions 23 (i.e., n-type regions 23). The n-type regions are self-aligned to one sidewall of the trench because the AD SiO$_2$ region was self aligned there, as shown in FIG. 3C. The n-type regions may have an n-type concentration of approximately 10$^{19}$ As/cm$^3$. In the above-mentioned modification of the first embodiment, the n-type regions are self-aligned to both sidewalls.

Figure 2C:
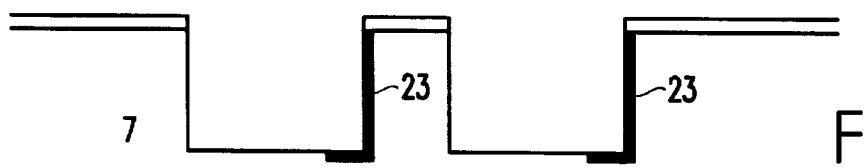

Then, the sacrificial oxide 14 and the ADSiO$_2$ 12A are stripped, as shown in FIG. 2C.

In step 6, the trenches are lined with a conformal oxide trench liner (COTL) 13 formed of oxide or nitride of Si or the like.

Figure 2D:
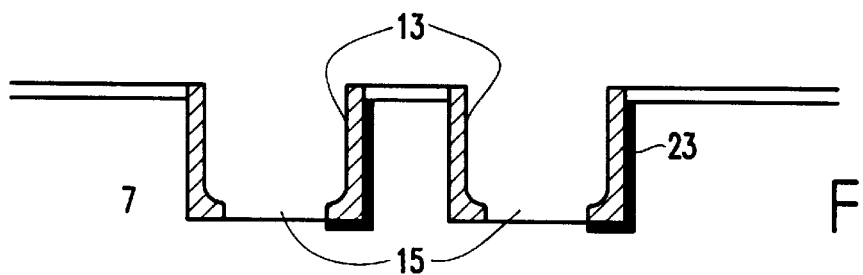

In step 7 (e.g., see FIG. 3D), which represents a critical lithography step, windows 15 located at the intersection points of the row and column lines are patterned. These regions are in the bottom surface of the lined trenches. Thus, the windows 15 are formed in the oxide trench liner 13. The conformal oxide trench liner is removed in these regions, exposing the Si substrate 7, as shown in FIG. 2D.

In step 8, deep n-type regions 17 (e.g., typically having a depth of between 0.3 $\mu$m to 0.6 $\mu$m) are implanted in the silicon substrate 7 at the windows 15. The n-dopant is activated at high temperature (1000° C. to 1100° C. and typically 1050° C.), and shallow (localized) p-type regions 19 are implanted in the silicon substrate 7 (e.g., preferably a shallow boron implant) at the windows 15.

A barrier 21 preferably formed by depositing Ti/TiN or other silicide contact forming metals is deposited and heated to form a TiSi$_2$/TiN barrier, and thereafter the boron is activated. This represents the end of high temperature processes in the method of the first embodiment of the present invention.

Figure 2E:
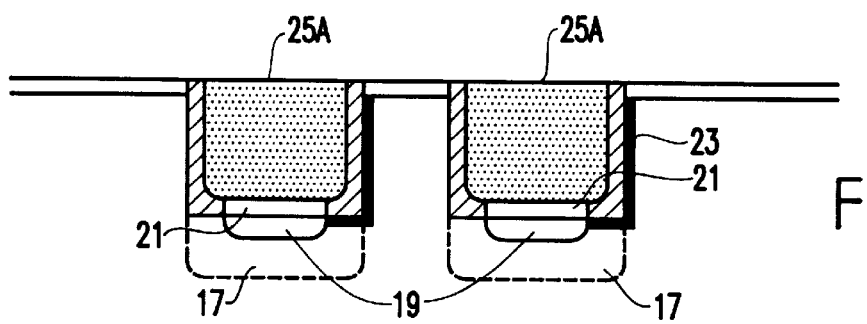

In step 9, the trenches are filled with a row line conductor metal 25a. Preferably, the row conductor metal is tungsten because it is a refractory metal unaffected by the temperature of the remaining processes. Copper could also be used because of its advantage of lower resistance, but careful control of the temperature of the remaining process steps would be required to preserve the copper line. The row line conductor metal 25a is planarized by CMP to the hard mask 9, as shown in FIG. 2E.

In step 10, the metal 25a in the trenches is recessed to a depth substantially within a range of approximately 0.15 to 0.45 $\mu$m by selective reactive ion etching (RIE) or the like. The remaining metal conductor 25 represents the row line. The remaining metal is approximately 0.4×0.4 $\mu$m or less and has an approximately square cross-section.

Figure 2F:
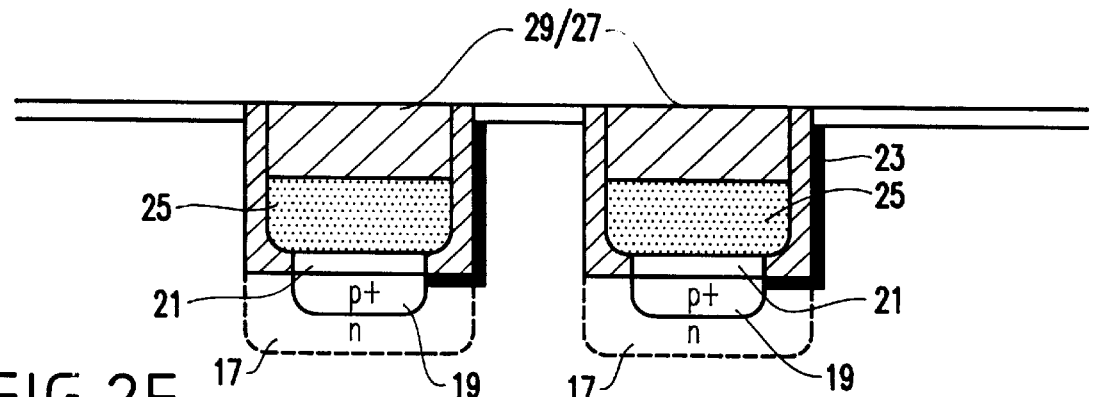

In step 11, the upper regions of the trenches are filled with a low temperature (e.g., in a range of approximately 400° C. to 700° C.) oxide 27, such as deposited silicon dioxide, and the oxide is planarized by CMP to the hard mask 9, as shown in FIG. 2F.

The structure is now complete to FIG. 2F.

A process of forming the conducting strap regions now will be described, referring to FIGS. 2G–2H, for the preferred embodiment.

In step 12, lithography is used to define the recessed location 29A of the strap 29, one per cell along the length of the row line. This mask is used to remove a portion of layers 27 and 13 by reactive ion etching (RIE) with high selectivity for oxide over silicon to etch both the low temperature oxide 27 and the conformal oxide trench liner 13 on one side only of the trench, thereby forming recessed regions in the oxide 29A. It is noted that the conformal oxide trench liner 13 is removed on one sidewall of the trench 11 at arrow B, and left intact on the opposite sidewall, as shown in FIG. 2G at arrow A. This is a "self-aligning" feature of the present invention and provides many advantages and benefits. As seen in FIG. 3E in plan view, the recessed region is located at the same location as the window 15, as shown in FIG. 2D and plan view 3D, so the strap will contact the region 23 which contacts regions 17, 19 formed at window 15. In a modification to the first embodiment, not shown, this is done on both sides of the trench.

Thereafter, in step 13 a metal or doped Poly-Si is deposited to fill the recessed regions, thereby forming the "strap" 29. The strap makes ohmic contact 30 to the n-type regions on the sidewall of the recessed regions. The strap material fills cracks and irregularities.

In the modification to the first embodiment, not shown, the strap makes ohmic contact to two n-type regions on both sides of the trench. In the modification of the first embodiment, the diode has lower contact resistance.

Figure 2G:
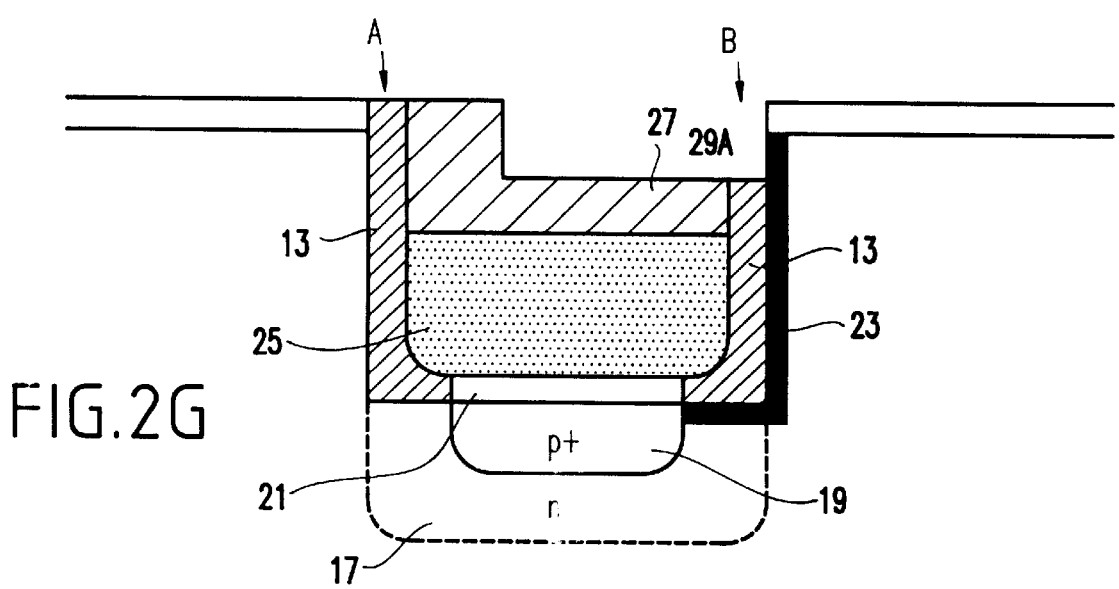
Figure 2H:
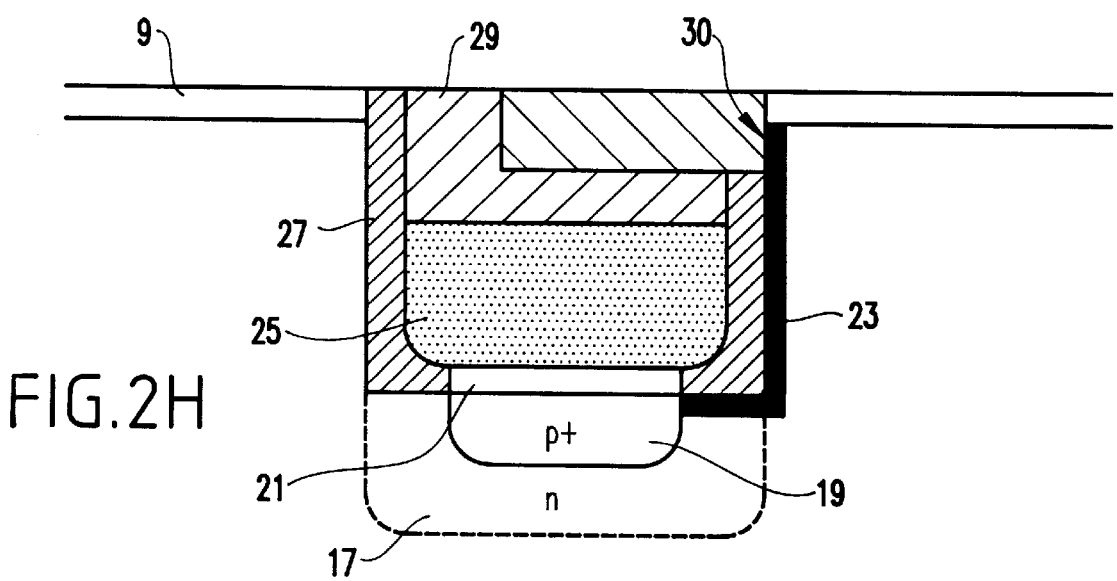

In step 14, the strap material is planarized by CMP to the surface of the hard mask 9, as shown in FIG. 2H.

After step 14, the magnetic tunnel junction (MTJ) is formed and patterned, the inter-layer dielectric (ILD) is deposited, and the column lines are formed, to complete the memory cell structure.

FIGS. 3A–3E illustrate plan views of the structure being formed in FIGS. 1A–1B, and specifically plan views of some of the steps shown in FIGS. 2A–2H.

Specifically, FIG. 3A illustrates the structure formed in FIG. 2A before deposition of As-doped $SiO_2$, whereas FIG. 3B illustrates a plan view of the structure formed at the completion of step 2B.

Further, FIG. 3C is a plan view of the n-type As-diffused regions after the solid source diffusion has been performed (FIG. 2C), and FIG. 3D illustrates a plan view of the step of FIG. 2D at the conclusion of the deep n and shallow $p^+$boron implantation but before boron diffusion. Further, FIG. 3E is the plan view after etching oxide 27 and corresponds to step 12 shown in the cross-section of FIG. 2G.

In the modification of the first embodiment, the $ADSiO_2$ is left on both sides of the trench, in step 4, and the location of the strap extends across the trench width in step 12 so COTL is removed at both locations A and B in FIG. 2G. In this way, the strap is larger and contacts the diode at two locations and the MTJ over a larger area.

Thus, the first embodiment according to the present invention provides a novel structure and method for forming the structure in which a magnetic memory cell structure contains a magnetic tunnel junction (MTJ) and a diode in series.

As shown, both the MTJ and the diode are in close proximity to a metal thin film wire (TFW), the TFW being used for conducting the write current which changes the MTJ resistance sate, and for addressing the memory cell.

With the invention according to the first embodiment, the diode is made in the crystal silicon substrate under the metal TFW (e.g., the TFW contacting one terminal of the diode), and the TFW being the row line and recessed in a trench in the silicon wafer substrate. Above the TFW electrode are located a thin insulator layer and the MTJ, respectively. The thickness of the insulator and strap thus defines the distance between the TFW and the MTJ.

In the first embodiment, the bottom metal conductor has a conventional cross-section, is located in a trench, and dry etching processes are used to make the recessed trench regions in the Si substrate.

Hence, the first embodiment provides a structure including a high conductivity diode with high rectification and minimal resistance.

Second Embodiment

A second embodiment according to the present invention is described below with reference to FIGS. 4A–4C.

Figure 4B:
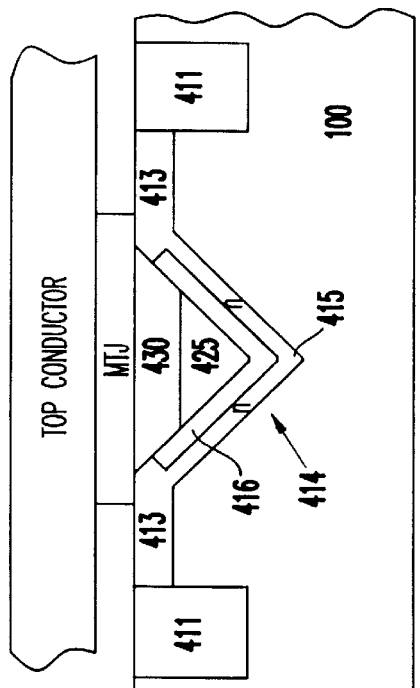
FIGS. 4A–4C illustrates a combination of plan and section views of a second, alternative embodiment of the present invention, and more specifically a V-groove structure for an MTJ cell according to the second embodiment of the present invention.
Figure 4C:
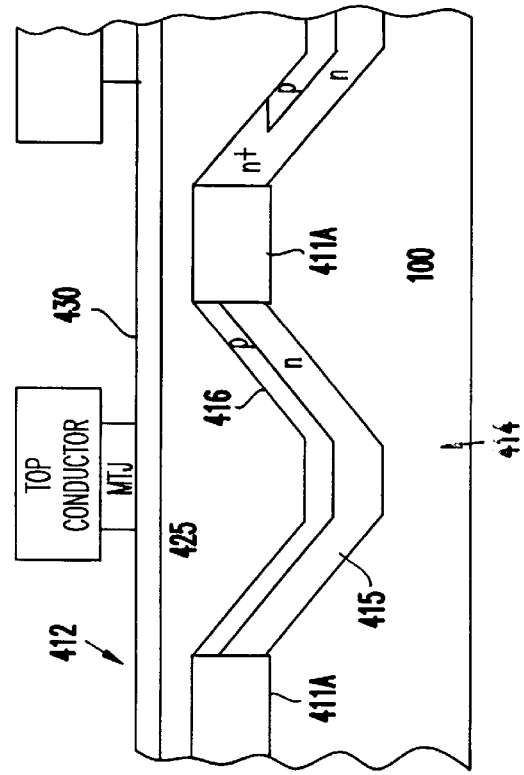
Figure 4A:
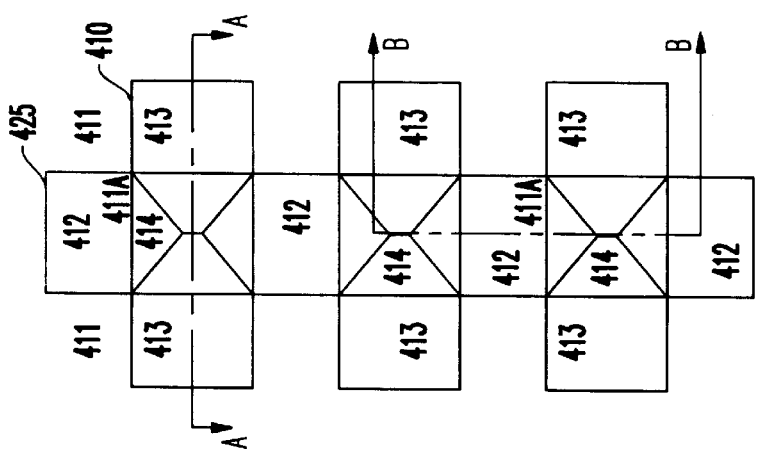

FIGS. 4A–4C show the second embodiment of the present invention wherein the diode is self-aligned to recessed regions denoted as V-grooves 414, and electrical connection to the bottom electrode of the diode (n region 415) is also self-aligned. An anisotropic wet etch or the like is used to make the recessed V-groove region in the silicon substrate. Materials and dimensions substantially similar to those described above can be employed, absent an indication to the contrary in the description below.

FIG. 4A is the plan view (top view) showing a bottom metal conductor (TFW) 425 drawn vertically, and three diodes formed at three recessed V-groove regions 414, respectively. In FIG. 4A, the three top metal conductors and the three MTJs are not shown, for clarity. It is noted that in FIG. 4A, the lines for V-grooves 414 are approximately 55° diagonals, but generally do not meet in the center because typically the height of V-groove 414 is greater than the width of the groove 414.

FIG. 4B is a sectional view through plane A—A of FIG. 4A. Plane A—A becomes the center line of the top metal conductor in the completed memory array. The MTJ and then the top metal conductor are formed above V-groove 414 and extend to the left and right where there would be additional memory cells.

FIG. 4C is a sectional view through plane B—B. Plane B—B is the center line of the bottom metal conductor 425.

Referring to FIG. 4A, in the method of forming the V-groove structure for the MTJ cell structure (e.g., assuming a P-N diode as an exemplary case), first shallow trench isolation (STI) trench regions 411 are formed so as to enclose regions 410 where the original silicon surface remains, as shown. Then, n+ silicon regions are formed by implanting the surface of the silicon substrate 100 (e.g., approximately 0.1 $\mu$m to 0.3 $\mu$m deep in the exemplary embodiment and preferably 0.2 $\mu$m). Next, a masking layer is formed with long, narrow holes (trenches) corresponding to bottom metal conductor 425.

Thereafter, portions of the STI oxide isolation 411 are recessed below the substrate surface, forming recessed regions 412 (seen in plan view in FIG. 4A) above the remaining oxide isolation 411A, as shown in crosssectional view of FIG. 4C.

Thereafter, a V-groove is formed self-limited to the region 414 as shown in FIGS. 4A–4C. The V-groove is limited by recessed oxide isolation 411A, and stops at the edge of the masking layer defined by rectangle 425 which was defined by a photolithography step with a photoresist mask or the like. At the STI border, etching proceeds partially from the side but forms a clean groove at completion. After the V-groove etch, the $n^+$silicon regions 410 are reduced to regions 413.

Thereafter, deep n implants 415 are formed for the diode in the groove, and thereafter shallow $p^+$implants 416 for the diode are formed. The location of the $p^+$implant 416 is controlled by a patterned photoresist so the p implant region does not reach the top of the V-groove and remains separated from the MTJ, as shown in FIG. 4B. Obviously, the conductivities may be reversed as would be known by one of ordinary skill in the art. Then, a metallic conductor is formed, by depositing a thin barrier layer TiN or the like and a metal (e.g., tungsten or copper) in the V-groove and polishing off the metal to the original substrate surface.

Then, the metal is recessed by uniform etching below the STI surface about 0.2 μm forming recessed lines and the bottom metal conductor defined by the 425 rectangle.

Then, as shown in FIG. 4C, silicon diode layer 430 is deposited and planarized by CMP or the like to the substrate surface, so as shown in FIG. 4C, the diode is self-aligned with the STI 411.

Regarding the details of the contact region of the second embodiment, the n+ surface region 413 is shallower (thinner) than the recessed insulator 430, so the converted p region is also shallower than the recessed insulator 430. Bottom conductor 425 only contacts the p region (see FIG. 4B), so there is no direct contact between the n+surface region and the bottom conductor 425.

Also note in FIG. 4B that the MTJ only contacts the n+ surface region 413 because of insulator 430, and does not contact bottom conductor 425. The size of region 413 can be less than 0.5 F, even with misregistration of conductor 425 and n+silicon region 410, at least one portion of n+surface regions 413 will be wide enough to contact the MTJ. In order to produce the densest memories, the rectangle 410 could be smaller so n+regions 413 on the lefthand side would not be formed in processing. This would produce a smaller cell, but has higher diode contact resistance.

Third Embodiment

Figure 5B:
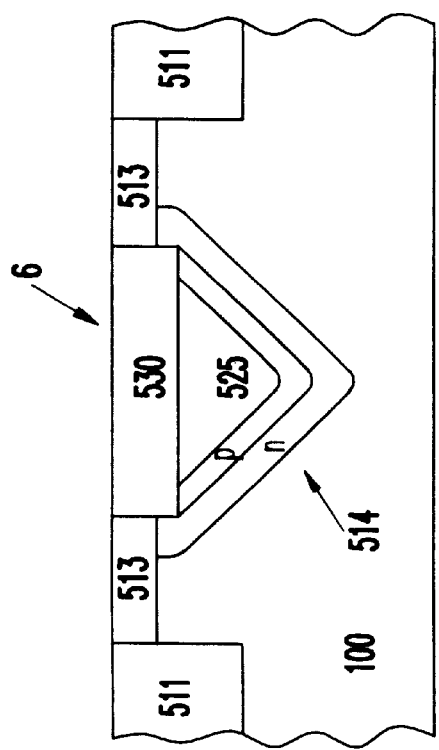
FIGS. 5A–5C illustrate a plan view and two sectional views describing the process to make the alternative embodiment of FIGS. 4A–4C, and more specifically a fabrication of a recessed V groove and diode in silicon wafer substrate under the MTJ.
Figure 5C:
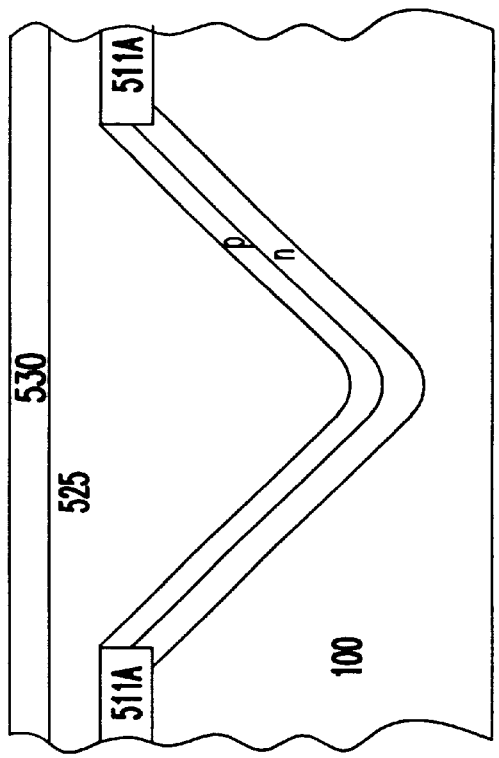
Figure 5A:
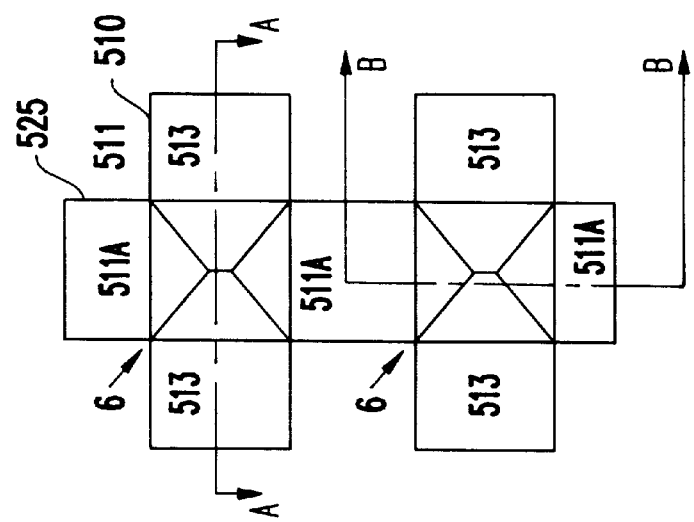

FIGS. 5A–5C show the third embodiment of the present invention wherein the diode is self-aligned to recessed regions denoted as an etched recess in silicon 6 and the recess for the diode has a top portion with straight walls and a sloped portion below so the p region, which is on the sloped portion, is below the substrate surface.

FIG. 5A is a plan view showing a bottom metal conductor 525, drawn vertically, and two diodes 4 formed at two recessed regions 6. The two top metal conductors and the two MTJs are not shown, for clarity and ease of understanding. Similarly to FIG. 4A, STI 511 is formed outside rectangles 510, and is recessed at regions 511A.

FIG. 5B is a sectional view through plane A—A. Plane A—A becomes the center line of the top metal conductor in the completed memory array. The MTJ and the top metal conductor (not shown) in turn are formed above the structure shown. The V-groove is recessed to near the bottom of the n region 513, with substantially vertical walls in the silicon substrate, and sloped walls below region 513, so that the diode 514 with p and n layers shown are also recessed. The diode's p layer has no electrical contact with the n region 513 which then can have a surface doping level of several times $10^{19}/cm^3$. Oxide isolation layer 530 is thicker than n region 513 to prevent a connection between n layer 513 and either bottom conductor 525 or the p layer. FIG. 5C is a sectional view through plane B—B. Plane B—B is the center line of the bottom metal conductor 525, which fills the space above recessed insulator 511A and insulator 530.

Fabrication of the third embodiment is similar to the second embodiment, but with changes to produce the structural differences.

As in the second embodiment, rectangle 510 can be smaller, forming a single n region 513 and thereby a smaller cell.

Thus, with the present invention, a MRAM is produced in which the MTJ is in very close proximity to the lower conductor and single crystal Si diodes can be employed.

The present invention improves over the conventional arrangements because here the diode is made in a single crystalline semiconductor, and further the diode location is automatically self-aligned with the recessed metal line. Additionally, the present cell can occupy an area of approximately 1 metal pitch by 1 metal pitch. Therefore, high areal density arrays of the present structure are easily fabricated, and the areal density may exceed that of a typical DRAM cell.

While the invention has been described in terms of several preferred embodiments, those skilled in the art will recognize that the invention can be practiced with modification within the spirit and scope of the appended claims.

Having thus described our invention, what we claim as new and desire to secure by Letters Patent is as follows:

1. A magneto-resistive memory cell, comprising:

a substrate;

a single crystalline semiconductor diode formed in said substrate;

a first thin film conductor recessed in said substrate;

a magnetic tunnel junction formed above said first conductor; and a second thin film conductor formed above said magnetic tunnel junction, wherein said diode and said first thin film conductor share a non-planar common surface, such that said magnetic tunnel junction is a predetermined distance from said thin film conductor.

2. A nonvolatile memory cell structure, comprising:

a silicon substrate;

a diode formed in said substrate;

a first conductor located above said diode, and recessed in a trench formed in said substrate;

an insulator layer located above said first conductor;

a magnetic tunnel junction located above said insulator layer; and a second conductor located above said magnetic tunnel junction.

3. The memory cell structure according to claim 2, wherein said first and second conductors comprise first and second thin film wires, respectively.

4. The memory cell according to claim 2, wherein an upper surface of said insulator layer comprises a planarized layer and is coplanar with a top surface of said silicon substrate.

5. A memory, comprising:

a magnetic tunnel junction;

a diode coupled to said magnetic tunnel junction and including first and second contacts; and a metallic conductor coupled to said diode, wherein a non-planar surface is shared by the metal conductor and a contact of said diode.

6. The memory according to claim 5, wherein the non-planar surface is one of recessed below and raised above a surface of the silicon substrate.

7. The memory according to claim 5, wherein said non-planar surface comprises a surface with a vertical extent.

8. The memory according to claim 5, wherein a plurality of diodes are connected to a plurality of magnetic tunnel junctions and said metallic conductor.

9. The memory according to claim 8, wherein said non-planar surface comprises a surface with a vertical extent shared by the metal conductor and a contact of each of said diodes.

10. A memory, comprising:

a magnetic tunnel junction;

a diode coupled to said magnetic tunnel junction and including first and second contacts; and a metallic conductor coupled to said diode, wherein a non-planar surface is shared by the metal conductor and a contact of said diode and, wherein the shared surface includes a sloped surface and is recessed below the surface of a silicon wafer substrate.

11. The memory according to claim 10, wherein said sloped surface is sloped at an angle substantially between approximately 53 and approximately 57 degrees.

12. The memory according to claim 11, wherein said sloped surface is sloped at an angle of substantially 55 degrees.

13. The memory according to claim 5, wherein the shared surface is the vertical edge of said metal conductor.

14. The memory according to claim 13, wherein said conductor comprises a patterned metallic conductor.

15. The memory according to claim 5, wherein the shared surface comprises a vertical edge etched into said silicon substrate.

16. The memory according to claim 5, wherein the shared surface comprises a vertical edge recessed into said silicon substrate.

17. A nonvolatile memory cell structure, comprising:

a crystal silicon wafer substrate;

an ion-implanted diode formed in said substrate;

a first thin film wire located above said diode, and recessed in a trench in said substrate;

an insulator layer located above said first thin film wire;

a magnetic tunnel junction located above said insulator layer; and a second thin film wire located above said magnetic tunnel junction.

18. The memory cell according to claim 17, wherein an upper surface of said insulator layer comprises a planarized layer and is coplanar with a top surface of said silicon substrate.

19. The memory cell according to claim 18, wherein said planarized layer comprises a chemical mechanical polish (CMP) planarized layer.

20. A magnetic memory cell, comprising:

a magnetic tunnel junction;

a semiconductor single crystal silicon diode coupled to said magnetic tunnel junction in series; and a metal thin film wire, positioned a predetermined distance from said magnetic tunnel junction for conducting a write current which changes the magnetic tunnel junction resistance state, and addressing the memory cell.

21. The memory cell according to claim 20, wherein said diode is made in a crystal silicon substrate under the metal thin film wire, said metal thin film being an electrode of said diode, and being a conductor recessed in a trench in the silicon substrate, wherein, above the thin film wire, are located a thin insulator layer and the MTJ, respectively, a thickness of the insulator defining the predetermined distance between the thin film wire and said magnetic tunnel junction.

22. The memory cell according to claim 21, wherein said conductor comprises a metal conductor, said trench being formed by a dry etching process in the silicon substrate.

23. The memory cell according to claim 22, wherein in a contact region, an n$^+$surface region is shallower tanm the insulator, such that there is no direct contact between the n$^+$surface region and the metal conductor.

24. The memory cell according to claim 20, wherein said predetermined distance is less than 0.04 µm.

* * * * *